United States Patent
Kang

(10) Patent No.: US 6,885,365 B1
(45) Date of Patent: Apr. 26, 2005

(54) GLASS TOUCH SENSING CIRCUIT

(75) Inventor: Sang-Seog Kang, Changwon Gyeongnam (KR)

(73) Assignee: LG Electronics Inc., Seoul (KR)

( * ) Notice: Subject to any disclaimer, the term of this patent is extended or adjusted under 35 U.S.C. 154(b) by 120 days.

(21) Appl. No.: 09/704,761

(22) Filed: Nov. 3, 2000

(30) Foreign Application Priority Data

Jun. 13, 2000 (KR) ........................................ 2000-32413

(51) Int. Cl.$^7$ ................................................ G09G 5/00
(52) U.S. Cl. ..................... 345/173; 345/174; 345/175; 345/176; 345/177; 345/210; 345/208; 178/18.02; 178/18.06; 178/19.03; 361/179; 361/181; 307/116; 307/139; 382/124; 340/562
(58) Field of Search ................ 178/18.02, 18.06, 178/19.03; 307/116, 139; 361/179, 181; 382/124; 340/562; 345/174, 175, 176, 173, 177, 1.1, 208, 210

(56) References Cited

U.S. PATENT DOCUMENTS

| | | | | |
|---|---|---|---|---|
| 4,081,700 A | * | 3/1978 | Hamilton, II | 307/116 |
| 4,584,519 A | * | 4/1986 | Gruodis | 323/245 |
| 5,065,168 A | * | 11/1991 | Tsuchiya et al. | 347/194 |
| 5,153,572 A | * | 10/1992 | Caldwell et al. | 340/712 |
| 5,465,091 A | * | 11/1995 | Nishino et al. | 341/33 |
| 5,933,102 A | * | 8/1999 | Miller et al. | 341/33 |
| 5,943,516 A | * | 8/1999 | Uchiyama et al. | 396/281 |
| 5,973,417 A | * | 10/1999 | Goetz et al. | 307/129 |
| 6,119,678 A | * | 9/2000 | Marchand | 312/236 |
| 6,396,506 B1 | * | 5/2002 | Hoshino et al. | 345/650 |
| 6,445,383 B1 | * | 9/2002 | Chambers et al. | 345/173 |
| 6,545,614 B1 | * | 4/2003 | Kasai | 341/33 |
| 6,630,929 B1 | * | 10/2003 | Adler et al. | 345/177 |
| 6,647,133 B1 | * | 11/2003 | Morita et al. | 382/124 |

* cited by examiner

*Primary Examiner*—Xiao Wu
*Assistant Examiner*—Abbas Abdulselam
(74) *Attorney, Agent, or Firm*—Fleshner & Kim, LLP

(57) ABSTRACT

A glass touch sensing circuit which is capable of accurately detecting a sense signal resulting from a user's touch under no influence of variations in temperature. The glass touch sensing circuit is adapted to compare the level of an output signal from a switching device, which indicates whether the user touches a touch sensor, with that of a reference signal and convert the output signal from the switching device into a wave-shaped signal in accordance with the compared result. The present glass touch sensing circuit is further adapted to determine the level of the reference signal for compensation for a variation in the output signal from the switching device with temperature. Therefore, the glass touch sensing circuit can be employed in a human body touch-based key input sensing system to provide a constant performance irrespective of a variation in temperature so as to sense a key input based on a touching operation.

24 Claims, 3 Drawing Sheets

GLASS TOUCH SENSING CIRCUIT

BACKGROUND OF THE INVENTION

1. Field of the Invention

The present invention relates in general to glass touch sensing circuits, and more particularly to a glass touch sensing circuit which is capable of accurately detecting a sense signal resulting from a user's touch under no influence of variations in temperature.

2. Description of the Prior Art

Glass touch sensing circuits are generally adapted to input a command generated when the user touches a specific area on a display screen. These sensing circuits are used for the input of commands in a variety of household electric appliances and electronic products such as high-class microwave ovens, notebook computers, display screens, televisions, etc.

FIG. 1 is a circuit diagram showing the construction of a conventional glass touch sensing circuit. As shown in this drawing, the conventional sensing circuit comprises a touch sensor 5 for outputting a sense signal in response to a user's touch, and a resistor R1 and capacitor C1 interacting to convert the sense signal from the touch sensor 5 into a switching signal to a transistor Q1, which will hereinafter be described in detail.

The resistor R1 has its one end connected to an output terminal of the touch sensor 5 and its other end connected to a connection point A. Commonly connected to the connection point A are one end of the capacitor C1, one end of a resistor R4 and a base terminal of the transistor Q1. The other end of the capacitor C1, the other end of the resistor R4 and an emitter terminal of the transistor Q1 are connected in common to a first output terminal OUT1 of a microprocessor 15, which will hereinafter be described in detail.

The transistor Q1 is adapted to perform a switching operation in response to the switching signal converted by the resistor R1 and capacitor C1, so as to generate a low signal having a falling edge depth differently determined depending on a switching period of time. The conventional glass touch sensing circuit further comprises a resistor R3 and capacitor C2 interacting to remove a noise component from the low signal from the transistor Q1 and apply the resultant low signal as a clock signal to a D flip-flop 10, which will hereinafter be described in detail.

A resistor R2 has its one end connected to terminal 1 which inputs a supply voltage of 5V end connected in common to one end of the the other end of which is connected to the and a collector terminal of the transistor Q1. The low signal from the transistor Q1 is noise-removed by the resistor R3 and capacitor C2 and then applied as a clock signal to a clock terminal $\overline{CK}$ of the D flip-flop 10.

The D flip-flop 10 is adapted to provide its output signal in response to the 5V supply voltage inputted by the input terminal 1, and the microprocessor 15 is adapted to provide its output signal for the control of the operation of the D flip-flop 10. The microprocessor 15 is further adapted to monitor the output signal from the D flip-flop 10 and recognize the user's contact with the touch sensor 5 as a result of the monitoring.

The D flip-flop 10 has an input terminal D, preset terminal $\overline{PR}$ and voltage terminal VCC connected in common to the input terminal 1 which inputs the 5V supply voltage. The D flip-flop 10 further has an output terminal Q connected to an input terminal IN1 of the microprocessor 15. A second output terminal OUT2 of the microprocessor 15 is connected to a clear terminal $\overline{CLR}$ of the D flip-flop 10, which also has a ground terminal GND connected to a ground voltage source. The first output terminal OUT1 of the microprocessor 15 is connected commonly to the emitter terminal of the transistor Q1, resistor R4 and capacitor C1, as stated above.

Next, a description will be given of the operation of the conventional glass touch sensing circuit with the above-entioned construction.

FIG. 2 is a timing diagram of output signals from the respective components in the conventional glass touch sensing circuit of FIG. 1.

The 5V supply voltage inputted by the input terminal 1 is always applied to the input terminal D of the D flip-flop 10. Under this condition, the microprocessor 15 provides an output signal OUT1 as shown in FIG. 2 at its first output terminal OUT1 at intervals of predetermined time to sense the user's touch with the touch sensor 5.

The output signal OUT1 from the microprocessor 15 is applied to the emitter terminal of the transistor Q1, thereby causing a potential difference to be generated between the emitter terminal and collector terminal of the transistor Q1 when the output signal OUT1 is low in level.

If the user touches the touch sensor 5 under the above condition, then a voltage being charged and discharged by the resistor R1 and capacitor C1 becomes higher in level due to an electrostatic capacity of the human body, thereby causing a turning-on period of time of the transistor Q1 to become longer than that when the user does not come into contact with the touch sensor 5.

In other words, because the transistor Q1 is switched in response to the voltage being charged and discharged by the resistor R1 and capacitor C1, it remains ON for a predetermined period of time even though the user does not come into contact with the touch sensor 5. However, in the case where the user touches the touch sensor 5, the amount of charge stored in the user is added to the voltage being charged and discharged by the resistor R1 and capacitor C1, resulting in an increase in the level of the charged and discharged voltage.

As a result, the voltage being charged and discharged by the resistor R1 and capacitor C1 when the user comes into contact with the touch sensor 5 is different in level from that when the user does not do so, thereby causing turning-on periods of the transistor Q1 in both cases to be different from each other.

Upon being turned on, the transistor Q1 generates a clock signal $\overline{CK}$, which is low in level as shown in FIG. 2, owing to a potential difference generated between its collector terminal and emitter terminal. At this time, the low signal generated by the transistor Q1 has a falling edge depth determined depending on a turning-on period of the transistor Q1. In other words, the low signal generated by the transistor Q1 while the user comes into contact with the touch sensor 5 has a falling edge depth greater than that while the user does not do so.

The low signal generated by the transistor Q1 is noise-removed by the resistor R3 and capacitor C2 and then applied to the clock terminal $\overline{CK}$ of the D flip-flop 10.

The D flip-flop 10 outputs a high signal at its output terminal Q synchronously with the low signal, or low voltage, received at its clock terminal. It should be noted that, in a normal operation state, the D flip-flop 10 is enabled in response to a low signal applied under the condition of the user's contact with the touch sensor 5 and not enabled in response to a low signal applied under the condition of the user's noncontact with the touch sensor 5.

Then, the output signal from the D flip-flop 10 is applied to the input terminal IN1 of the microprocessor 15. Such a signal from the D flip-flop 10 is indicated by "INPUT SIGNAL IN1" in FIG. 2. Upon receiving the output signal from the D flip-flop 10, the microprocessor 15 recognizes the user's contact with the touch sensor 5 and then provides an output signal OUT2 at its second output terminal OUT2, which is low in level as shown in FIG. 2. The low signal from the microprocessor 15 is applied to the clear terminal $\overline{\text{CLR}}$ of the D flip-flop 10 to clear the D flip-flop 10.

In other words, in the conventional glass touch sensing circuit, the D flip-flop 10 is enabled in response to a low signal applied to its clock terminal $\overline{\text{CK}}$ when the user touches the touch sensor 5. Upon being enabled, the D flip-flop 10 outputs a high signal to the input terminal IN1 of the microprocessor 15, thereby causing the microprocessor 15 to recognize the user's contact with the touch sensor 5 and output a clear signal to the D flip-flop 10 so as to initialize it.

However, the above-described conventional glass touch sensing circuit has the following disadvantages.

The clock signal to the D flip-flop has no reference value which is accurately defined to enable the operation of the D flip-flop. This clock signal is defined only by the output signal from the transistor Q1 which has a falling edge depth varying according to whether the user touches the touch sensor 5. As a result, there is a concern that the D flip-flop could be different in enabling point according to individual specifications or manufacturers thereof, thereby causing each key in the touch sensor to be different in sensitivity and performance.

The conventional glass touch sensing circuit has a further disadvantage in that it varies in sensitivity with temperature. Namely, the transistor Q1, which is switched in response to the sense signal from the touch sensor 5, is so sensitive to variations in temperature that it remains ON for a lengthier period of time at a higher temperature and for a briefer period of time at a lower temperature, respectively. The output signal from the transistor Q1 varies with such a temperature variation, resulting in a variation in the low signal being applied to the clock terminal $\overline{\text{CK}}$ of the D flip-flop 10. Consequently, the touch sensor becomes different in sensitivity according to variations in temperature.

SUMMARY OF THE INVENTION

Therefore, the present invention has been made in view of the above problems, and it is an object of the present invention to provide a glass touch sensing circuit which is capable of providing a constant performance irrespective of variations in temperature.

It is another object of the present invention to provide a glass touch sensing circuit in which a touch sensor with a plurality of keys is constant in sensitivity.

In accordance with the present invention, the above and other objects can be accomplished by a provision of a glass touch sensing circuit comprising a touch sensor for providing its output signal in response to a user's touch; switching means having a switching period of time differently determined depending on the level of the output signal from the touch sensor; comparison means for compensating the level of a reference signal for a variation in temperature, comparing the level of an output signal from the switching means with that of the compensated reference signal and outputting a wave-shaped signal in accordance with the compared result; and touch detection means responsive to an output signal from the comparison means for detecting whether the user touches the touch sensor.

Preferably, the glass touch sensing circuit may further comprise charging/discharging means for charging and discharging a voltage which is different in level according to whether the user touches the touch sensor, and the switching time period of the switching means may be determined depending on the level of the voltage being charged and discharged by the charging and discharging means.

Preferably, the touch detection means may include signal output means for providing its output signal synchronously with the output signal from the comparison means; and recognition means for recognizing a touched key in response to the output signal from the signal output means.

More preferably, the recognition means may be adapted to recognize the input of the touched key and initialize the signal output means.

Preferably, the comparison means may include a thermistor for compensating the level of the reference signal for the temperature variation.

More preferably, the comparison means may further include a comparator having a first input terminal connected to an output terminal of the switching means, and a second input terminal for inputting a voltage determined in level by the thermistor and fixed resistors.

Preferably, the touch detection means may include a D flip-flop having a clock terminal connected to an output terminal of the comparison means, the D flip-flop being enabled in response to a clock signal being applied to the clock terminal; and a microprocessor having an input terminal connected to an output terminal of the D flip-flop, the microprocessor recognizing the user's touch with the touch sensor in response to an output signal from the D flip-flop and initializing the D flip-flop.

Preferably, the switching means may include a transistor turned on in response to the output signal from the touch sensor.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
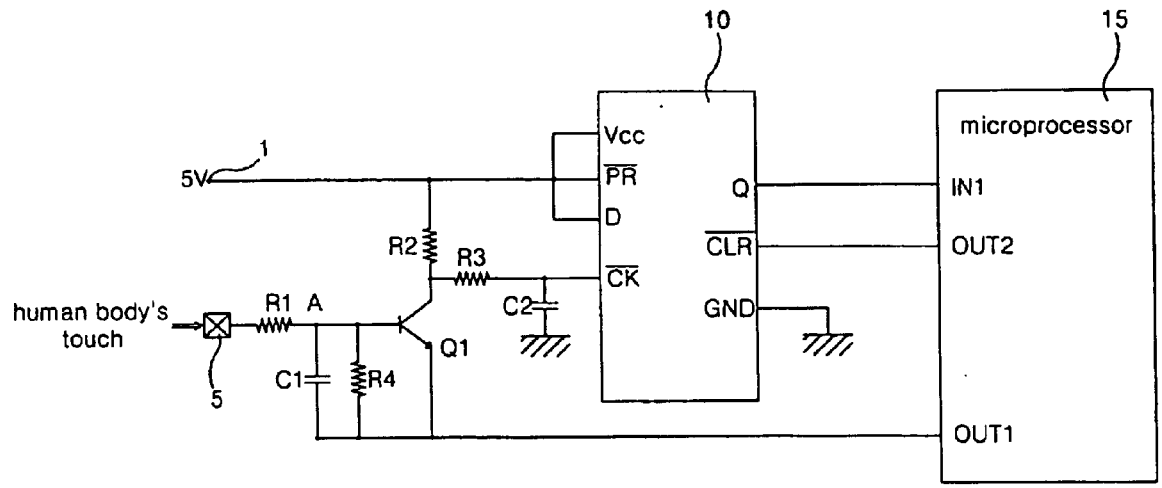
FIG. 1 is a circuit diagram showing the construction of a conventional glass touch sensing circuit.
Figure 2:
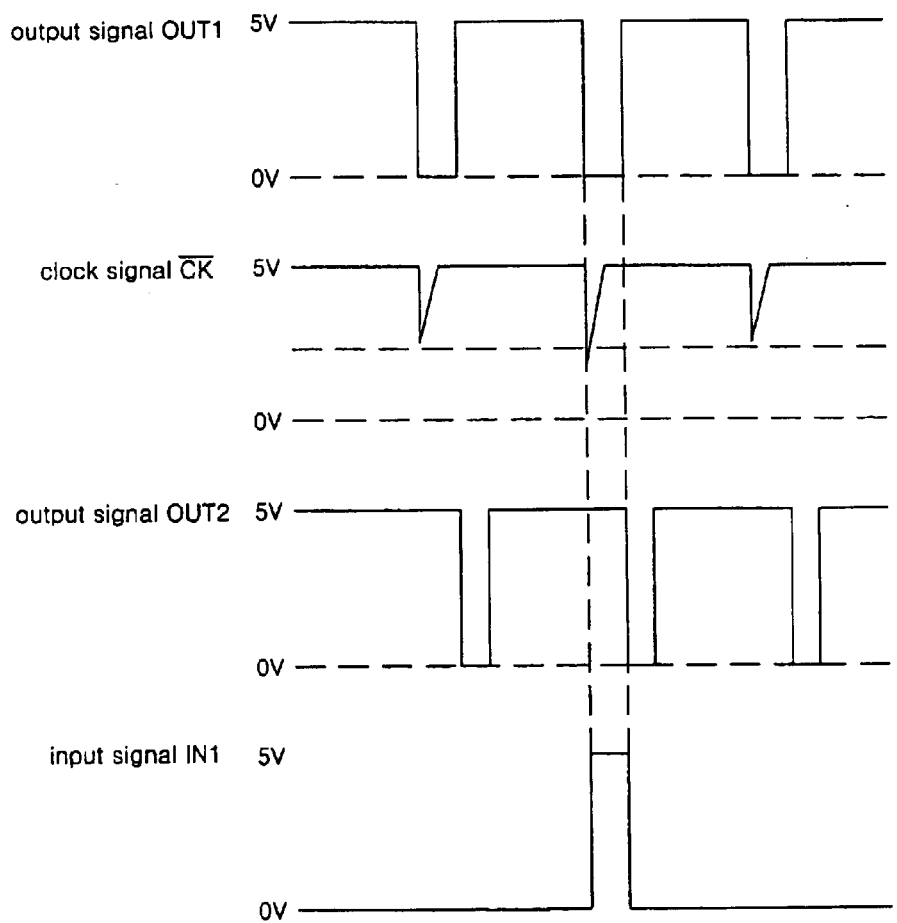
FIG. 2 is a timing diagram of output signals from respective components in the conventional glass touch sensing circuit of FIG. 1.
Figure 3:
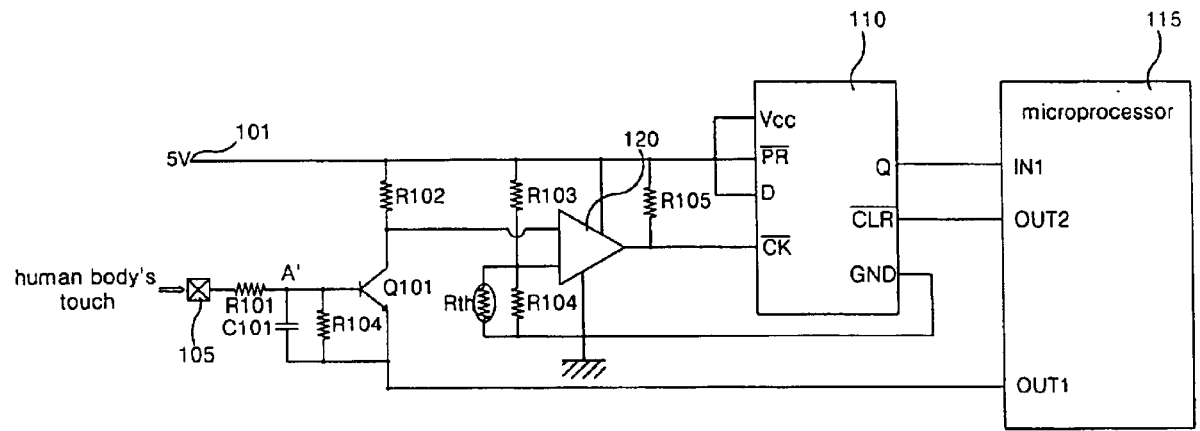
FIG. 3 is a circuit diagram showing the construction of a glass touch sensing circuit in accordance with the present invention.

FIG. 3 is a circuit diagram showing the construction of a glass touch sensing circuit in accordance with the present invention.

As shown in FIG. 3, the glass touch sensing circuit of the present invention comprises a touch sensor 105 for outputting a sense signal in response to a user's touch, a resistor R101 and capacitor C101 interacting to convert the sense signal from the touch sensor 105 into a switching signal, and a transistor Q101 having a switching period of time differently determined depending on the level of the switching signal converted by the resistor R101 and capacitor C101 (i.e., the level of a voltage being charged and discharged by the resistor R101 and capacitor C101).

The transistor Q101 operates as a switching device in response to the sense signal from the touch sensor 105. It should be noted that a switching device employed in the present glass touch sensing circuit is not limited to the above transistor Q101. Any other switching device can replace the transistor Q101 so long as it is capable of performing a switching operation in response to the sense signal from the touch sensor 105.

Describing the above-mentioned construction in more detail, the resistor R101 has its one end connected to an output terminal of the touch sensor 105 and its other end connected to a connection point A'. Commonly connected to the connection point A' are one end of the capacitor C101, one end of a resistor R104 and a base terminal of the transistor Q101. The other end of the capacitor C101, the other end of the resistor R104 and an emitter terminal of the transistor Q101 are connected in common to a first output terminal OUT11 of a microprocessor 115, which will hereinafter be described in detail. The transistor Q101 further has a collector terminal connected to an input terminal 101, which inputs a supply voltage of 5V, via a resistor R102.

The present glass touch sensing circuit further comprises a comparator 120 for inputting a low signal having a falling edge depth differently determined depending on a switching period of time of the transistor Q101, comparing the level of the inputted low signal with that of a reference signal compensated for a variation in temperature and outputting a wave-shaped signal as a result of the comparison.

In other words, the comparator 120 functions to convert an output signal from the transistor Q101 into a wave-shaped signal. It should be noted that a wave-shaped signal output device employed in the present glass touch sensing circuit is not limited to the above comparator 120. Any other electrical device can replace the comparator 120 so long as it is capable of performing the same function.

Describing the above-mentioned construction in more detail, the comparator 120 has a first input terminal connected to the collector terminal of the transistor Q101 and a second input terminal for inputting the reference signal compensated for a variation in temperature.

The reference signal to the comparator 120 is determined in level by reference signal determination means composed of a pair of fixed resistors R103 and R104 connected in series between the 5V supply voltage input terminal 101 and a ground voltage source, and a thermistor Rth connected in parallel to the fixed resistors R103 and R104. This reference signal determination means is adapted to adjust the level of the reference signal variably with temperature.

The present glass touch sensing circuit further comprises a D flip-flop 110 for receiving an output signal from the comparator 120 as a clock signal. The microprocessor 115 is adapted to provide its output signal for the control of the operation of the D flip-flop 110, monitor an output signal from the D flip-flop 110 and recognize the user's contact with the touch sensor 105 as a result of the monitoring.

In other words, the D flip-flop 110 acts as a signal output device for providing its output signal based on the user's contact with the touch sensor 105. The microprocessor 115 acts as a recognition device for recognizing the user's contact with the touch sensor 105 from the output signal from the D flip-flop 110. It should be noted that a signal output device and recognition device employed in the present glass touch sensing circuit are not limited to the above D flip-flop 110 and microprocessor 115. Any other devices can replace the D flip-flop 110 and microprocessor 115 so long as they are capable of performing the same functions.

Describing the above-mentioned construction in more detail, the D flip-flop 110 has an input terminal D, preset terminal $\overline{PR}$ and voltage terminal VCC connected in common to the input terminal 101 which inputs the 5V supply voltage. The D flip-flop 110 further has an output terminal Q connected to an input terminal IN11 of the microprocessor 115. A second output terminal OUT12 of the microprocessor 115 is connected to a clear terminal $\overline{CLR}$ of the D flip-flop 110, which also has a ground terminal GND connected to the ground voltage source. The first output terminal OUT11 of the microprocessor 115 is connected commonly to the emitter terminal of the transistor Q101, resistor R104 and capacitor C101, as described above.

Next, a detailed description will be given of the operation of the glass touch sensing circuit with the above-described construction in accordance with the present invention with reference to FIGS. 4 and 5.

Figure 4:
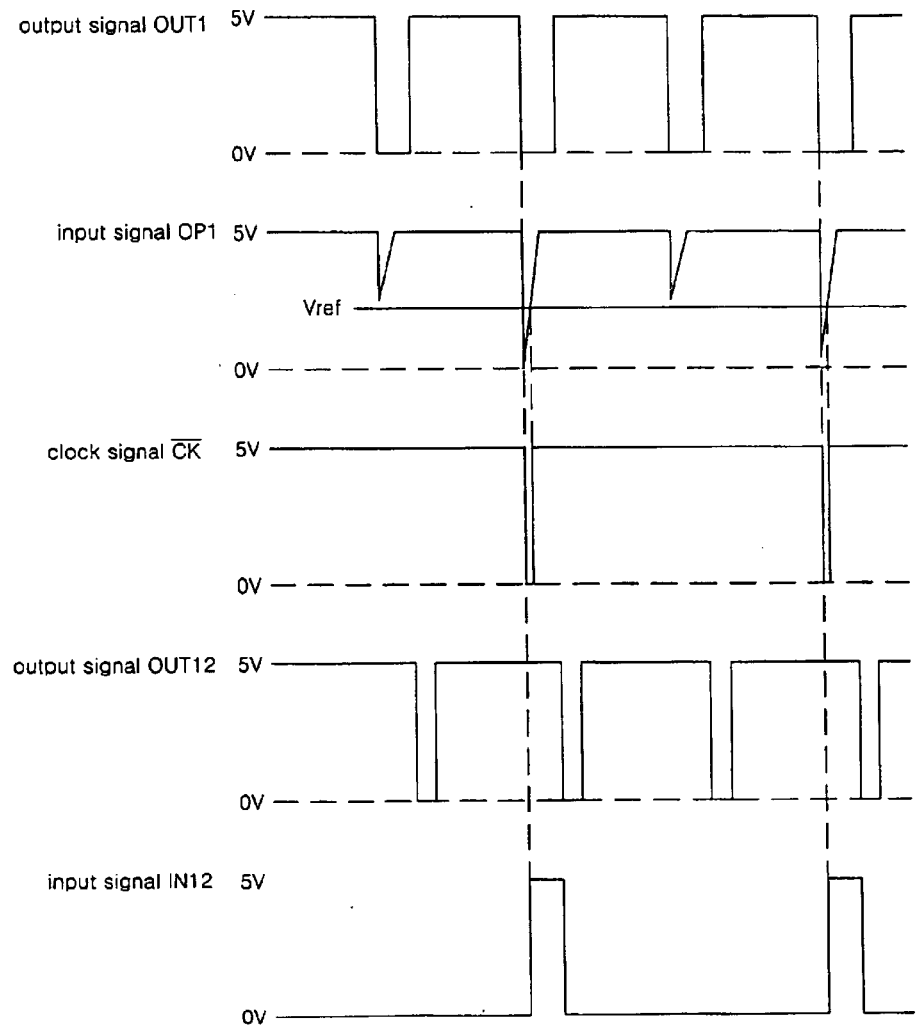
FIG. 4 is a timing diagram of output signals from respective components in the glass touch sensing circuit of FIG. 3.
Figure 5:
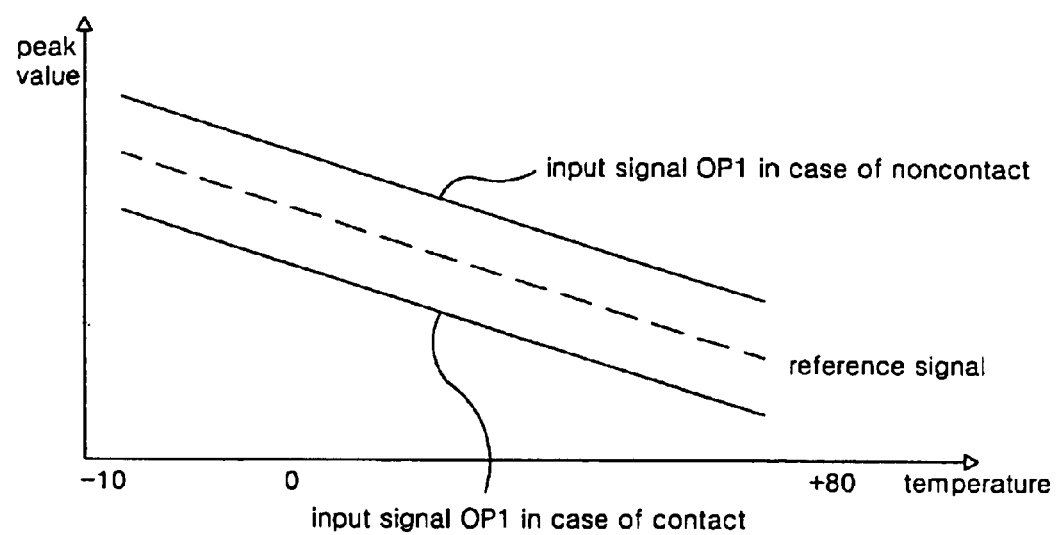
FIG. 5 is a waveform diagram illustrating a variation in a reference voltage with temperature in accordance with the present invention.

FIG. 4 is a timing diagram of output signals from the respective components in the glass touch sensing circuit of FIG. 3 and FIG. 5 is a waveform diagram illustrating variations in the reference signal or voltage and transistor output signal with temperature.

The 5V supply voltage inputted by the input terminal 101 is always applied to the input terminal D of the D flip-flop 110. Under this condition, the microprocessor 115 provides an output signal OUT11 as shown in FIG. 4 at its first output terminal OUT11 at intervals of predetermined time to sense the user's touch with the touch sensor 105.

The output signal OUT11 from the microprocessor 115 is applied to the emitter terminal of the transistor Q101, the collector terminal of which is also applied with a high level voltage of about 5V via the resistor R102. As a result, a potential difference is generated between the emitter terminal and collector terminal of the transistor Q101 when the output signal OUT11 from the microprocessor 115 is low in level.

If the user touches the touch sensor 105 under the above condition, then a voltage being charged and discharged by the resistor R101 and capacitor C101 becomes higher in level due to an electrostatic capacity of the human body, thereby causing a turning-on period of time of the transistor Q101 to become longer than that when the user does not come into contact with the touch sensor 105.

That is, since the transistor Q101 is switched in response to the voltage being charged and discharged by the resistor R101 and capacitor C101, it remains ON for a predetermined period of time even though the user does not come into contact with the touch sensor 105. Alternatively, in the case where the user touches the touch sensor 105, the amount of charge stored in the user is added to the voltage being charged and discharged by the resistor R101 and capacitor C101, resulting in an increase in the level of the charged and discharged voltage.

Consequently, the voltage being charged and discharged by the resistor R101 and capacitor C101 when the user comes into contact with the touch sensor 105 is different in level from that when the user does not do so. As a result, turning-on periods of the transistor Q101 in the above two cases become different from each other.

While being turned on, the transistor Q101 generates a low signal as indicated by "INPUT SIGNAL OP1" in FIG. 4, because of a potential difference generated between its collector terminal and emitter terminal. The low signal INPUT SIGNAL OP1 generated by the transistor Q101 while the user comes into contact with the touch sensor 105 is determined to have a falling edge depth greater than that while the user does not do so.

In other words, when the user touches the touch sensor 105, the turning-on period of time of the transistor Q101 becomes longer by a predetermined value than that when the user does not come into contact with the touch sensor 105, so as to output a low signal having a greater falling edge depth.

Noticeably, the transistor Q101 is a type of electrical device sensitive to a variation in temperature. In this regard, the transistor Q101 has a longer switching period of time at a higher temperature and a shorter switching period of time at a lower temperature, respectively. Namely, as shown in FIG. 5, the switching time period of the transistor Q101 while the user touches the touch sensor 105 is different from that while the user does not do so, due to a variation in temperature, thereby causing the output signal of the transistor Q101 to vary in level.

The output signal ("INPUT SIGNAL OP1" in FIG. 4) from the transistor Q101, which varies in level, or falling edge depth, with temperature, is applied to the first input terminal of the comparator 120, the second input terminal of which inputs the reference signal. The comparator 120 compares the two input signals with each other in level and outputs a wave-shaped signal corresponding to a level difference therebetween.

The reference signal to the second input terminal of the comparator 120 has a level determined to compensate for a temperature variation. To this end, commonly connected to the second input terminal of the comparator 120 are the two fixed resistors R103 and R104 connected in series between the 5V supply voltage input terminal 101 and the ground voltage source and the thermistor Rth connected in parallel to the fixed resistors R103 and R104. The thermistor Rth has a resistance varying with temperature, which leads to a temperature-based variation in resistance determined by the resistance of the thermistor Rth and resistances of the two fixed resistors R103 and R104. As a result, the reference signal or voltage to the second input terminal of the comparator 120 varies in level with the resistance varying in the above manner, as shown in FIG. 5.

In other words, the comparator 120 compares the level of the output signal from the transistor Q101 with that of the reference voltage varying as stated above and outputs a wave-shaped signal, or a clock signal CK as shown in FIG. 4, corresponding to a level difference therebetween.

The wave-shaped low signal from the comparator 120 is applied to the clock terminal $\overline{CK}$ of the D flip-flop 110. The D flip-flop 110 outputs a high signal at its output terminal Q synchronously with the low signal, or low voltage, received at its clock terminal. As seen from time T2 in FIG. 4, the D flip-flop 110 is enabled in response to a low signal applied under the condition of the user's contact with the touch sensor 105 so as to output a high signal (indicated by "INPUT SIGNAL IN11" in FIG. 4). However, as seen from time T1 in FIG. 4, the D flip-flop 110 is not enabled in response to a low signal applied under the condition of the user's noncontact with the touch sensor 105, so as to provide no output signal.

The output signal from the D flip-flop 110, as indicated by "INPUT SIGNAL IN11" in FIG. 4, is applied to the input terminal IN11 of the microprocessor 115. Upon receiving the output signal from the D flip-flop 110, the microprocessor 115 recognizes the user's contact with the touch sensor 105 and then provides an output signal OUT12 at its second output terminal OUT12, which is low in level as shown in FIG. 4. The low signal from the microprocessor 115 is applied to the clear terminal $\overline{CLR}$ of the D flip-flop 110 to clear the D flip-flop 110.

To sum up, the present glass touch sensing circuit is characterized in that it comprises means for comparing the level of the output signal from the switching device, or transistor Q101, which indicates whether the user touches the touch sensor 105, with that of the reference signal and converting the output signal from the switching device into a wave-shaped signal in accordance with the compared result. The present glass touch sensing circuit is further characterized in that it comprises means for determining the level of the reference signal for compensation for a variation in the output signal from the switching device with temperature.

Therefore, the present glass touch sensing circuit is capable of converting the output signal from the switching device into a wave-shaped signal using the reference signal compensated for a temperature variation, thereby making it possible to define the low signal to the clock terminal $\overline{CK}$ of the D flip-flop 110 as an accurate value. As a result, the microprocessor 115 in the present glass touch sensing circuit can provide a constant performance irrespective of variations in temperature to recognize the user's contact with the touch sensor 105.

In the present embodiment, the circuitry for recognition of the user's contact with the touch sensor 105 is implemented in the form of a unitary module. As an alternative, a plurality of modules may be implemented to recognize respective key inputs to a touch sensor, which has a plurality of keys on a display screen, without departing from the scope and spirit of the invention.

As stated above, the basic technical concept of the present invention is to compensate the level of a reference signal for a variation in temperature and output a wave-shaped signal based on a touching operation using the compensated reference signal.

As apparent from the above description, the present invention provides the following advantages.

A glass touch sensing circuit can be employed in a human body touch-based key input sensing system to provide a constant performance irrespective of variations in temperature so as to sense a key input based on a touching operation. Therefore, the glass touch sensing circuit has the effect of increasing the reliability of an associated product.

Further, the glass touch sensing circuit can accurately detect a key input based on a touching operation by sensing it using a wave-shaped signal, thereby further increasing the reliability and performance of an associated product.

Moreover, the glass touch sensing circuit can provide the same performance for all key inputs in a system having a plurality of keys.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A glass touch sensing circuit, comprising:
   a touch sensor which provides a signal in response to a user's touch;
   a switch having a switching period of time differently determined depending on a level of the touch sensor signal;

a compensator which produces an independent temperature reference signal corresponding to a variation in temperature of the glass touch sensing circuit, and compares an output signal from said switch proportional to the touch sensor signal with that of the independent temperature reference signal, said independent temperature reference signal and said output signal from said switch have substantially a same slope such that the compensator outputs a square wave-shaped signal in accordance with a compared result; and a touch detector responsive to an output signal from said compensator for detecting whether the user touched said touch sensor.

2. A glass touch sensing circuit as set forth in claim 1, further comprising:
a charging/discharging unit which charges and discharges a voltage which is different in level according to whether the user touches said touch panel, said switching time period of said switch determined depending on a level of said voltage charged and discharged by said charging/discharging unit.

3. A glass touch sensing circuit as set forth in claim 1, wherein said touch detector includes:
a signal output unit which provides an output signal synchronously with said output signal from said compensator; and
a recognition unit which recognizes a touched key in response to the output signal from said signal output unit.

4. A glass touch sensing circuit as set forth in claim 3, wherein said recognition unit recognizes an input of said touched key and initializes said signal output unit.

5. A glass touch sensing circuit as set forth in claim 1, wherein said touch detector includes:
a flip-flop having a clock terminal connected to an output terminal of said compensator, said flip-flop being enabled in response to a clock signal applied to said clock terminal; and
a processor having an input terminal connected to an output terminal of said flip-flop, said processor recognizing the user's touch with said touch sensor in response to an output signal from said flip-flop and initializing said flip-flop.

6. A glass touch sensing circuit as set forth in claim 1, wherein said compensator includes a thermistor which compensates for the level of said reference signal for the temperature variation.

7. A glass touch sensing circuit as set forth in claim 6, wherein said compensator further includes:
a comparator having a first input terminal connected to an output terminal of said switch, and a second input terminal for inputting a voltage determined in level by said thermistor and fixed resistors.

8. A glass touch sensing circuit as set forth in claim 1, wherein said switch includes a transistor which turns on in response to said output signal from said touch sensor.

9. A glass touch sensing circuit as set forth in claim 5, wherein said flip-flop is a D flip-flop.

10. A glass touch sensing circuit as set forth in claim 1, further comprising:
a pair of resistors connected in series to a supply input terminal and a ground source; and
a thermistor connected to an input terminal of a comparator included in the compensator and the ground source, and being in parallel to the pair of resistors.

11. A touch sensing system, comprising:
an input terminal for receiving a signal output from a touch sensor; and
a controller which processes the signal from the touch sensor based on an independent temperature reference signal corresponding to a variation in temperature to generate a touch detection signal,
wherein the controller includes:
a switch which outputs a switch signal based on the signal from the touch sensor;
a signal generator which generates a reference signal; and
a comparator which compares the switch signal to the reference signal,
wherein the signal generator includes a level-controller which controls a level of the reference signal based on temperature variation, and
wherein the level-controller varies the level of the reference signal to coincide with changes in the switch signal that result from variation in temperature such that the comparator outputs a square wave-shaped signal.

12. A touch sensing system as set forth in claim 11, wherein the controller processes the signal from the touch sensor in a manner which achieves a constant level of touch detection sensitivity in spite of temperature variation.

13. A touch sensing system as set forth in claim 11, wherein the controller includes:
a switch which outputs a switch signal based on the signal from the touch sensor, and
a compensator which compensates for variations in the switch signal based on temperature variation.

14. A touch sensing system as set forth in claim 11, wherein the controller generates the touch detection signal based on an output of the comparator.

15. A touch sensing system as set forth in claim 11, wherein the level-controller decreases the level of the reference signal to a first non-zero value as temperature increases, and increases the level of the reference signal to a second non-zero value as temperature decreases.

16. A touch sensing system as set forth in claim 11, wherein the level-controller includes a thermistor which outputs a voltage value that varies the level of the reference value based on temperature variation of the touch sensing system.

17. A touch sensing system as set forth in claim 11, further comprising:
a pair of resistors connected in series to a supply input terminal and a ground source; and
a thermistor connected to an input terminal of the comparator and the ground source, and being in parallel to the pair of resistors.

18. A touch sensing system, comprising:
a switch which outputs a switch signal based on a touch sensor signal; and
a controller which compensates for variations in a turning-on period of the switch to generate a touch detection signal by comparing an independent temperature reference signal corresponding to a variation in temperature with the switch signal output from the switch,
wherein the controller includes;
a comparator for comparing the switch signal to a reference signal having substantially a same slope as the switch signal to generate a square waved-shape compensated switch signal.

19. A touch sensing system as set forth in claim 18, wherein the controller compensates for variations in falling edge depth of the switch signal output from the switch.

20. A touch sensing system as set forth in claim 18, wherein the controller generates the touch detection signal based on the compensated switch signal.

21. A touch sensing system as set forth in claim 20, wherein the controller includes:

a compensator which varies the reference signal based on temperature variations.

22. A touch sensing system as set forth in claim 21, wherein the compensator includes a thermistor which outputs a value for varying the reference signal based on temperature variations.

23. A touch sensing system as set forth in claim 20, wherein the controller includes:

a flip-flop circuit having an input connected to the output of the comparator and an output for supplying the touch detection signal, wherein the compensated switch signal is input into a clock terminal of the flip-flop.

24. A glass touch sensing system as set forth in claim 18, further comprising:

a pair of resistors connected in series to a supply input terminal and a ground source; and a thermistor connected to an input terminal of the comparator and the ground source, and being in parallel to the pair of resistors.

* * * * *